(12) United States Patent
Matsuki et al.

(10) Patent No.: US 7,339,269 B2
(45) Date of Patent: Mar. 4, 2008

(54) HIGH FREQUENCY IC PACKAGE, HIGH FREQUENCY UNIT USING HIGH FREQUENCY IC PACKAGE, AND MANUFACTURING METHOD THEREOF

(75) Inventors: Hiroaki Matsuki, Kobe (JP); Masayoshi Shouno, Kobe (JP); Tomohiko Tamaki, Kobe (JP)

(73) Assignee: Fujitsu Ten Limited, Kobe-shi (JP)

( * ) Notice: Subject to any disclaimer, the term of this patent is extended or adjusted under 35 U.S.C. 154(b) by 194 days.

(21) Appl. No.: 10/220,409

(22) PCT Filed: Nov. 19, 2001

(86) PCT No.: PCT/JP01/10103

§ 371 (c)(1), (2), (4) Date: Aug. 29, 2002

(87) PCT Pub. No.: WO03/032385

PCT Pub. Date: Apr. 17, 2003

(65) Prior Publication Data

US 2003/0094694 A1    May 22, 2003

(30) Foreign Application Priority Data

Sep. 28, 2001   (JP) .............................. 2001-301928

(51) Int. Cl.
*H01L 23/34* (2006.01)
(52) U.S. Cl. ..................................................... 257/728
(58) Field of Classification Search ........ 257/724–728, 257/678, E21.994
See application file for complete search history.

(56) References Cited

U.S. PATENT DOCUMENTS

| 5,796,165 A | 8/1998 | Yoshikawa et al. |
| 6,057,600 A * | 5/2000 | Kitazawa et al. ........... 257/728 |
| 2002/0074654 A1* | 6/2002 | Koriyama .................... 257/728 |

(Continued)

FOREIGN PATENT DOCUMENTS

EP    1 085 594 A2    3/2001

(Continued)

OTHER PUBLICATIONS

Patent Abstract of Japan, Publication No. 05211276 A, Published on Aug. 20, 1993, in the name of Yoshikawa Takeo.

(Continued)

*Primary Examiner*—Nathan W Ha
(74) *Attorney, Agent, or Firm*—Christie, Parker & Hale, LLP

(57) ABSTRACT

A high frequency IC package and high frequency unit are simplified and downsized, and the number of manufacturing processes is reduced. The part 9 to determine a characteristic of the high frequency IC chip is arranged outside the sealing 14 of the high frequency IC package 5. The part can be arranged on the package board 7, circuit board 4 or housing chassis 1. When the part is arranged outside the sealing, the package and the high frequency unit 6 on which the package is mounted can be downsized. In the case of arranging the part on the circuit board, the part can be mounted together with other surface mounting parts. Therefore, the number of manufacturing processes can be reduced.

11 Claims, 11 Drawing Sheets

U.S. PATENT DOCUMENTS

2003/0137046 A1* 7/2003 Kageyama ................. 257/704

FOREIGN PATENT DOCUMENTS

| JP | 5-63136 A | 3/1993 |
| JP | 5-211276 | 8/1993 |
| JP | 7-307412 A | 11/1995 |
| JP | 9-82826 A | 3/1997 |
| JP | 9-102433 | 4/1997 |
| KR | 1997-67892 | 10/1997 |

OTHER PUBLICATIONS

Patent Abstract of Japan, Publication No. 09102433 A, Published on Apr. 15, 1997, in the name of Inagawa Hideho.

International Search Report of PCT/JP01/10103, dated Feb. 19, 2002.

* cited by examiner

Fig.1
(A)
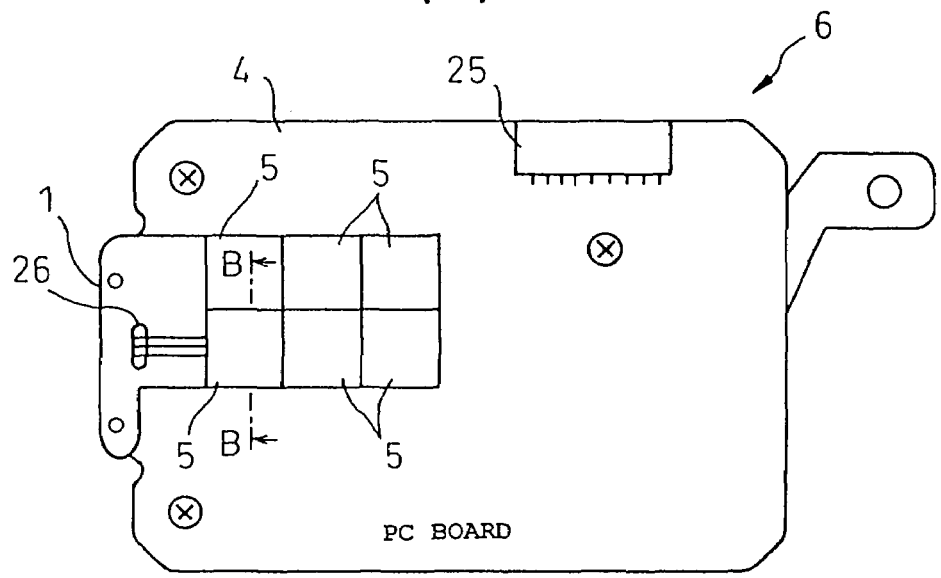
(B)
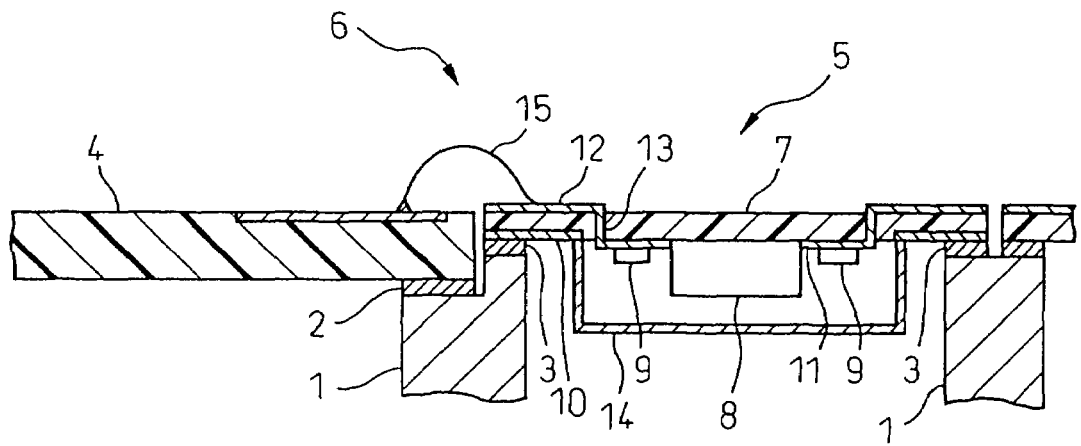

Fig.2
(A)
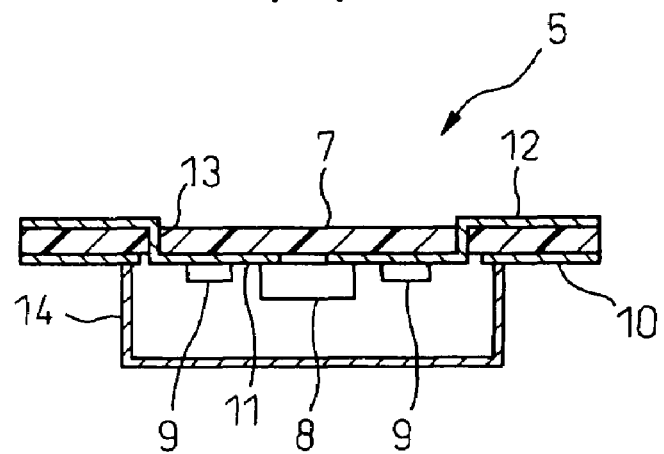
(B)
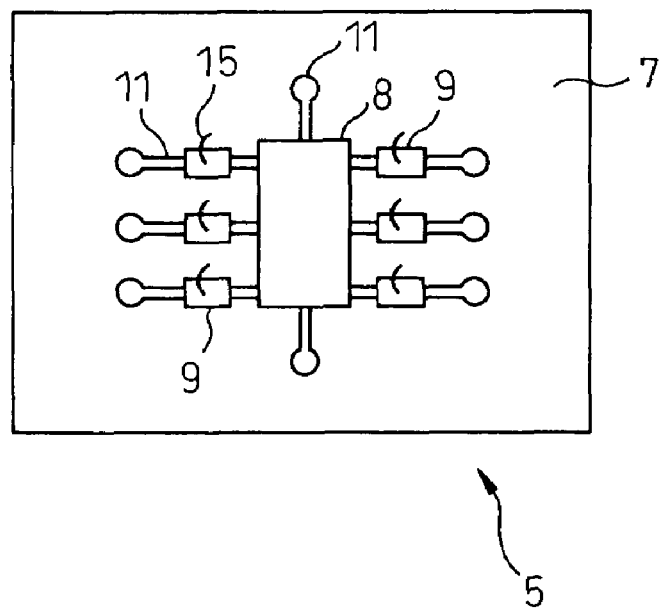

Fig.3
(A)
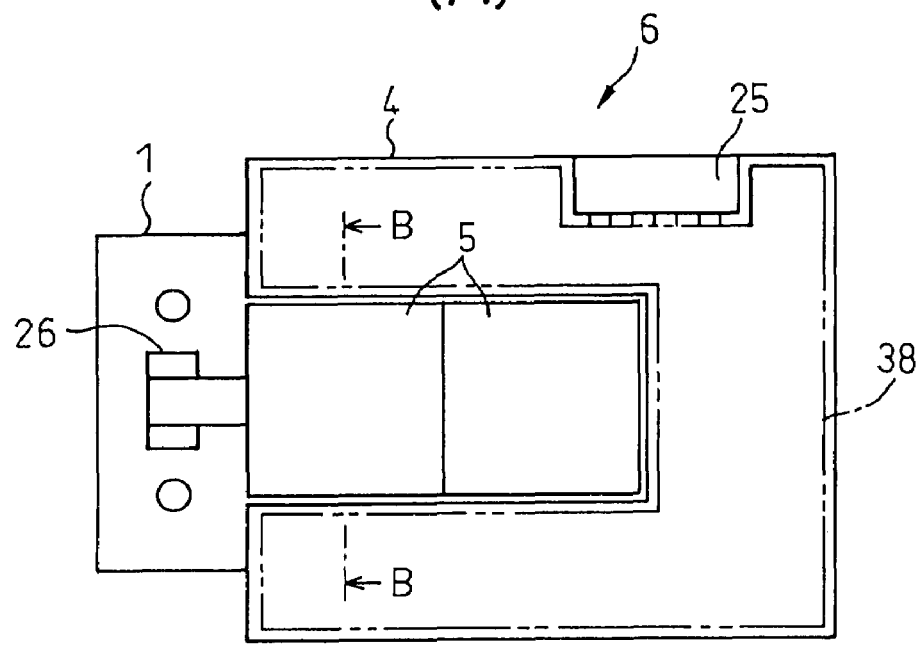
(B)
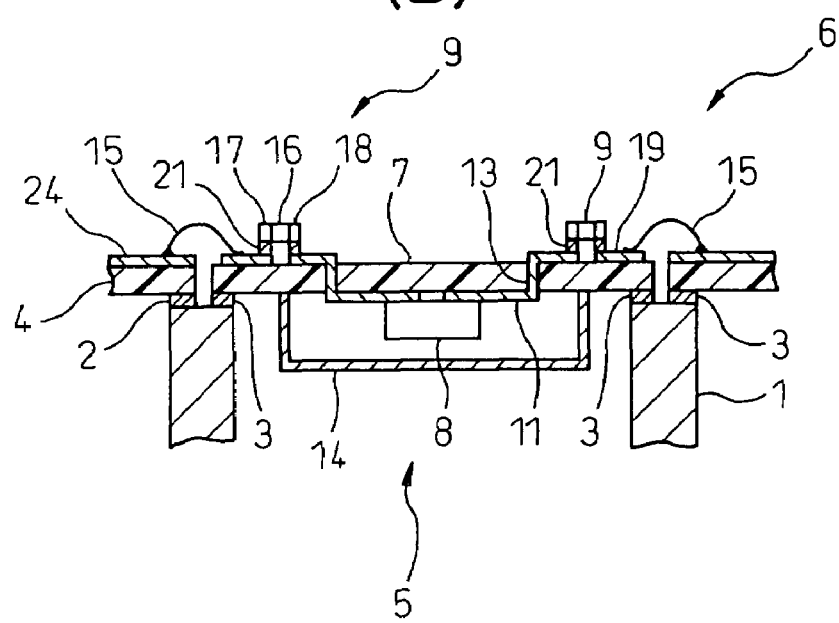

Fig.6
(A)
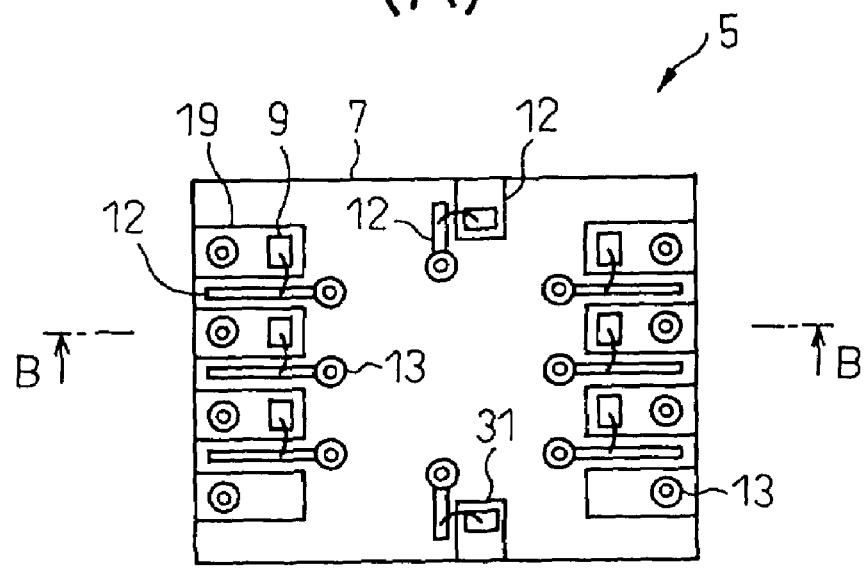
(B)
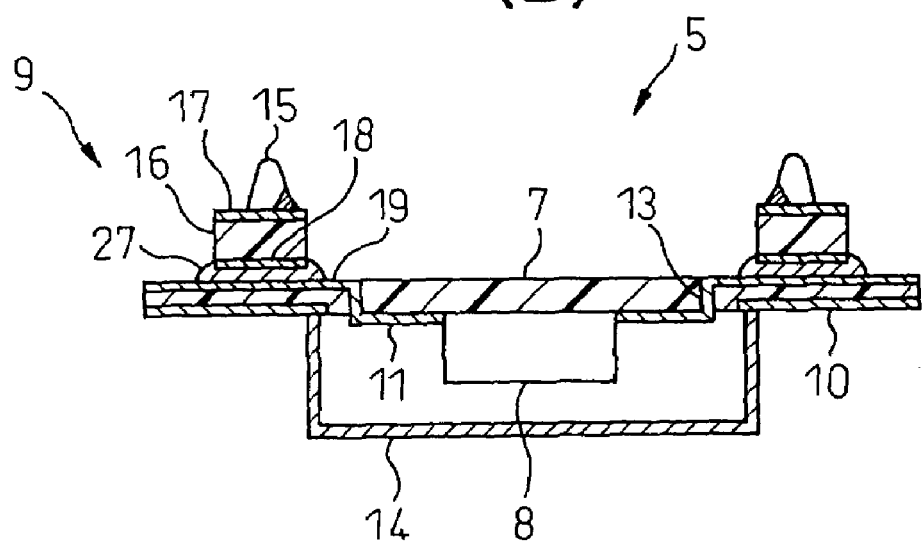

Fig.11
(A)
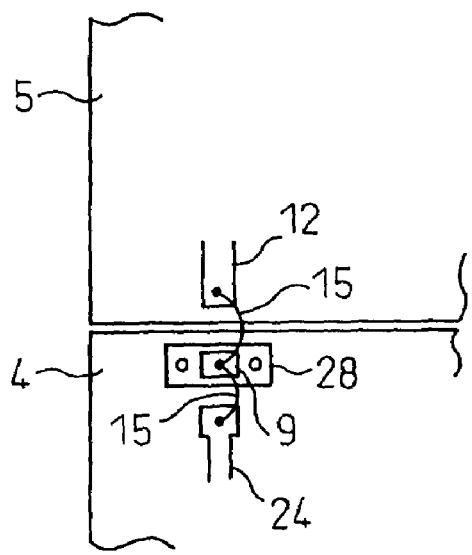
(B)
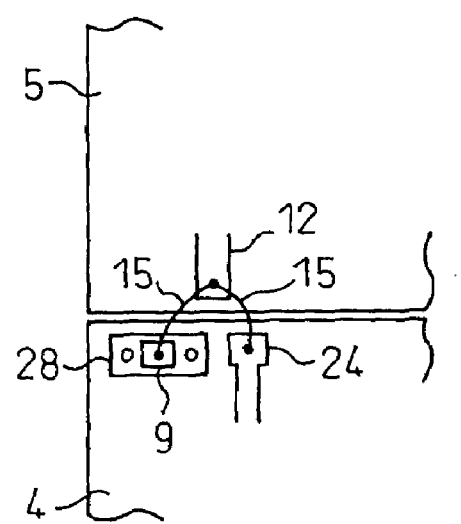
(C)
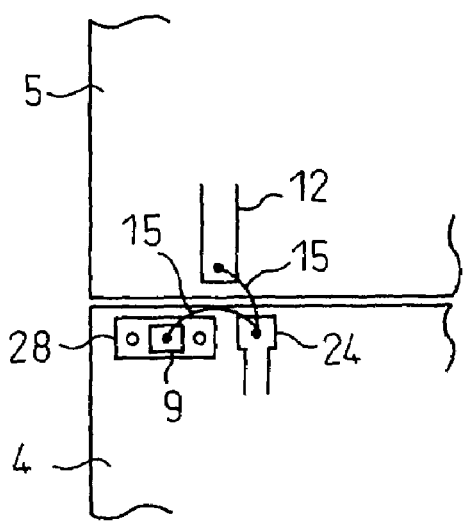

Fig.13
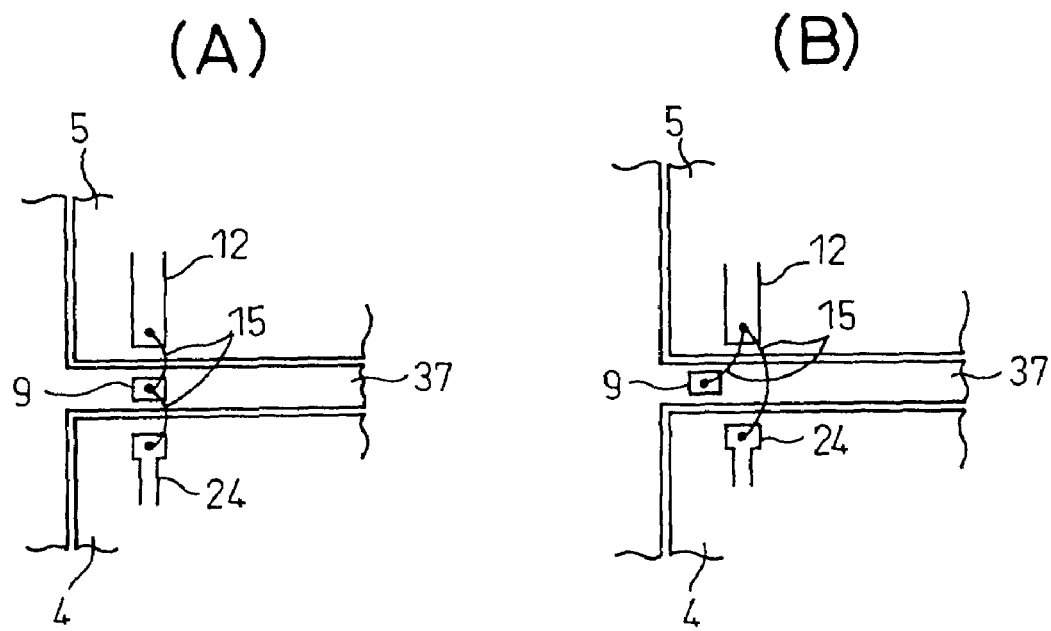
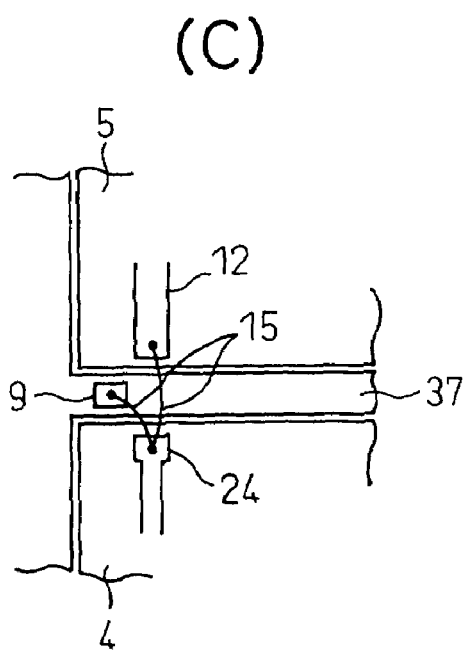

HIGH FREQUENCY IC PACKAGE, HIGH FREQUENCY UNIT USING HIGH FREQUENCY IC PACKAGE, AND MANUFACTURING METHOD THEREOF

CROSS-REFERENCE TO RELATED APPLICATION

This application is a national phase application of International application number PCT/JP01/10103, filed on Nov. 19, 2001, which claims priority of Japanese application number 2001-301928, filed Sep. 28, 2001.

TECHNICAL FIELD

The present invention relates to a high frequency IC package, a high frequency unit using the high frequency IC package, and a method of manufacturing the high frequency unit.

BACKGROUND ART

A millimeter wave or micro-wave unit (high frequency unit) used for a radar system incorporated into a vehicle is composed in such a manner that a circuit board, on which various parts are mounted, and MMIC package (Monolithic Microwave Integrated Circuit) (high frequency IC package) are mounted on a housing chassis.

FIG. 1 is a view showing a structure of a conventional high frequency unit. FIG. 1(A) is a plan view showing an outline of the arrangement, and FIG. 1(B) is a sectional view taken on line B-B in FIG. 1(A).

The circuit board 4 and six high frequency IC packages (MMIC packages) 5 are mounted on the housing chassis 1 via the conductive adhesive 2, 3 which will be referred to as an "adhesive" hereinafter. Other parts such as a connector 25 are mounted on the circuit board 4 and, further, the wave guide 26 is formed in the housing chassis 1. In this way, the high frequency unit 6 is composed. In this case, solder or gold or tin brazing may be used as the adhesive.

Referring to FIG. 2, the structure of the high frequency IC package 5 will be explained as follows. FIG. 2(A) is a sectional side view, and FIG. 2(B) is a bottom view of the high frequency IC package 5 from which the cap 14 has been removed.

On the lower face of the board 7 of the high frequency IC package 5, there are provided wiring patterns 11 connected to the high frequency IC chip 8. On the upper face of the board 7 of the high frequency IC package 5, there are provided wiring patterns 12 connected to an external circuit. The wiring patterns 11 on the lower face are connected to the wiring patterns 12 on the upper face via the via hole 13.

The high frequency IC chip 8 is mounted on the lower face wiring pattern 11 on the board 7. The bypass condensers 9 are mounted on the wiring pattern 11. The bypass condensers 9 are parts for determining a characteristic of the high frequency IC. For example, the bypass condensers 9 are provided for preventing the oscillation of the high frequency IC.

On the lower face of the board 7, there is provided a ground pattern 10. One of the electrodes of the bypass condenser 9 is connected to the ground pattern 10 by means of wire bonding connection 15. The high frequency IC chip 8 and bypass condensers 9 are sealed by the cap 14.

In the above conventional high frequency IC package, the bypass condensers 9 are contained in the cap 14 together with the high frequency IC chip 8. Therefore, it is necessary to conduct MCM mounting (Multi-chip module mounting), which causes difficult technical problems. Further, the package size is increased and the number of the manufacturing processes is increased. Therefore, it is difficult to reduce the manufacturing cost. As a result, it is difficult to reduce the size and cost of a millimeter wave unit in which the above high frequency IC package is used.

It is an object of the present invention to simplify and downsize the structure of a high frequency IC package and that of a high frequency unit in which the high frequency IC package is used.

It is another object of the present invention to reduce the number of the manufacturing processes of the high frequency IC package and that of the high frequency unit in the manufacturing method.

DISCLOSURE OF INVENTION

The present invention has been achieved to accomplish the above objects.

According to the first aspect of the present invention, in a high frequency IC package in which a high frequency IC chip is sealed on a board, parts (especially, parts for compensating a characteristic) for determining the characteristic of the high frequency IC chip are mounted on the board outside the seal of the high frequency IC package. Examples of the above parts are a bypass condenser, a coupling condenser, a temperature compensating condenser, a temperature compensating resistance and an impedance adjusting inductance.

The above parts may be attached to either one surface of the board, on which the high frequency IC package is mounted, the high frequency IC chip being mounted on the surface, or the other surface of the board.

According to the present invention, the parts conventionally mounted inside the sealing are mounted outside the sealing. Therefore, the high frequency IC package can be downsized and, further, it becomes unnecessary to conduct MCM mounting. Accordingly, the occurrence of defective chip connection can be decreased, and the yield can be enhanced.

According to the second aspect, in a high frequency unit including a high frequency IC package, a circuit board, on which the peripheral circuit is mounted, and a housing chassis on which the high frequency IC package and the circuit board are mounted, parts to determine a characteristic of the high frequency IC package are mounted on a circuit board onto which the peripheral circuit is incorporated.

According to the third aspect, in a high frequency unit including a high frequency IC package, a circuit board, on which the peripheral circuit is mounted, and a housing chassis on which the high frequency IC package and the circuit board are mounted, parts to determine a characteristic of the high frequency IC package are mounted on a housing chassis.

According to the second and the third aspects of the present invention, parts to determine a characteristic of the high frequency IC package can be automatically mounted by a mounting device. Due to the foregoing, it possible to reduce the number of manufacturing processes compared with above first aspect. Therefore, the manufacturing cost can be reduced.

BRIEF DESCRIPTION OF DRAWINGS

FIGS. 1A-B is a view showing a structure of a conventional high frequency unit.

FIGS. 2A-B is a view showing a structure of a high frequency IC chip shown in FIG. 1.

FIGS. 3A-B is a view showing a structure of a high frequency unit in Embodiment 1 of the present invention.

FIGS. 6A-B is a view showing a structure of a high frequency IC package of Variation 1 of Embodiment 1 of the present invention.

FIGS. 11A-C is a view showing a relation of the connection in FIG. 10.

FIGS. 13A-C is a view showing a relation of the connection in FIG. 12.

BEST MODE FOR CARRYING OUT THE INVENTION

Referring to the accompanying drawings, an embodiment in which the present invention is applied to a millimeter wave unit will be explained below.

In this connection, in the following example, explanations are made into a case in which a bypass condenser is used as a part for determining a characteristic of a high frequency IC chip. However, as described before, a coupling condenser, a temperature compensating condenser, a temperature compensating resistor and an impedance adjusting inductance can be used as a part for determining a characteristic of a high frequency IC chip.

Embodiment 1

Figure 4:
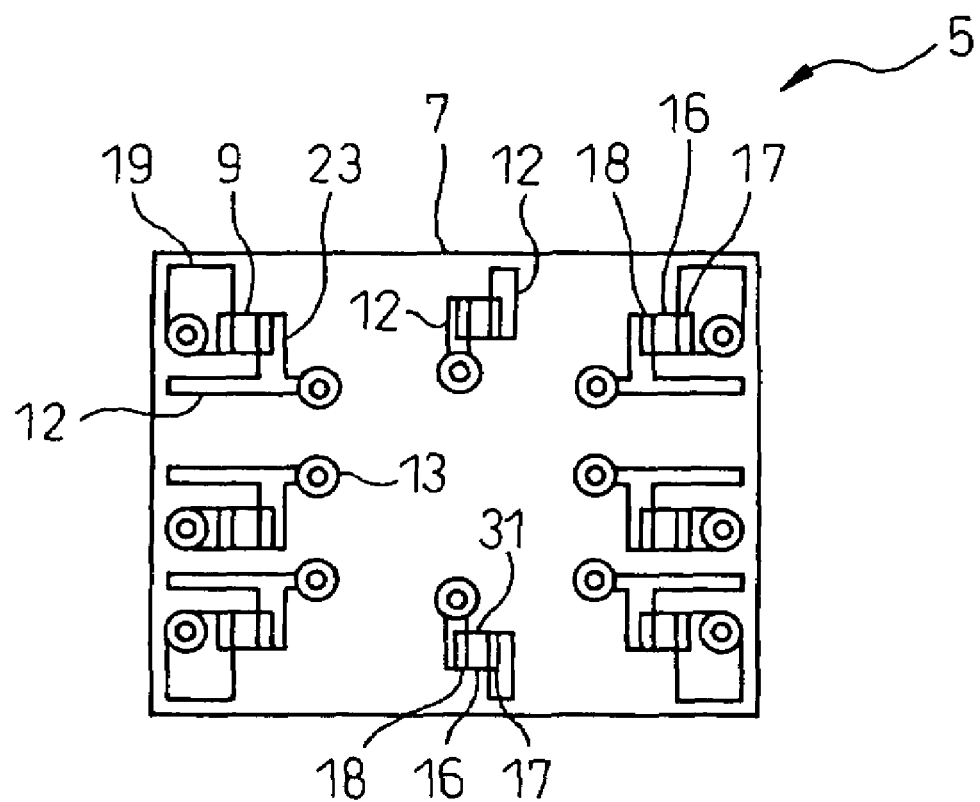
FIG. 4 is a view showing a structure of a high frequency IC package shown in FIG. 3.

Referring to FIGS. 3 and 4, the structure of a high frequency IC package to which the present invention is applied will be explained below. FIG. 3(A) is a plan view showing an outline of the structure of a high frequency unit. FIG. 3(B) is a sectional view taken on line B-B in FIG. 3(A). This sectional view shows the structure in detail. FIG. 4 is an upper view of the high frequency IC package.

The high frequency unit 6 is composed in such a manner that the circuit board 4 and two pieces of high frequency IC packages 5 are mounted on the housing chassis 1 via the conductive adhesive 2, 3 which will be referred to as an "adhesive" hereinafter. Further, the connector 25 and other parts are mounted on the circuit board 4, and the wave guide 26 is formed in the housing chassis 1. Furthermore, in the region 38 on the circuit board 4 indicated by two-dotted chain lines in FIG. 3, there are provided surface mounting parts such as an electric power source circuit on the input side of the high frequency IC package 5 and an amplifying circuit on the output side which compose an input and output circuit (peripheral circuit) with respect to the high frequency IC package 5.

In this connection, in the present invention, when the circuit board 4 and two pieces of high frequency IC packages 5 are made to adhere to the housing chassis 1, instead of using the adhesive 2, 3, it is possible to use other joining materials such as solder and gold-tin.

Alternatively, it is possible to provide a different joining means for joining the circuit board 4 and two pieces of high frequency IC packages 5 to the housing chassis 1 so that the circuit board 4 and two pieces of high frequency IC packages 5 can be made only electrically to come into contact with the housing chassis 1 in the portion shown in the drawing.

On the lower face of the board 7 of the high frequency IC package 5, there are provided wiring patterns 11 for mounting the high frequency IC chip 8. On the upper face of the board 7 of the high frequency IC package 5, there are provided wiring patterns 12, which are connected with external circuits and ground patterns 19.

The wiring patterns 11 and 12 are connected with each other via the via holes 13.

The high frequency IC chip 8 is mounted on the wiring patterns 11 provided on the lower face of the board 7. Therefore, the high frequency IC chip 8 is connected with the wiring patterns 11.

The high frequency IC chip 8 is sealed by the cap 14. In this connection, in the present invention, the sealing is not limited to the one conducted by the cap 14 but the sealing may be conducted by means of molding. In this case, the sealing means a member for protecting the high frequency IC chip 8.

On the upper face of the board 7, that is, on a surface of the board 7 opposite to the side on which the high frequency chip 8 is arranged, there are provided bypass condensers 9 for preventing the oscillation of high frequency waves from the high frequency IC package 5. For example, each bypass condenser 9 is of the cubic type and composed of the dielectrics 16 such as single layer ceramics and also composed of two pieces of electrodes 17, 18. The protrusions 23 opposing to the ground patterns 19 protrude from the wiring patterns 12. Electrodes 17 of the bypass condensers 9 are connected with the ground patterns 19 via the adhesive 21, and the electrodes 18 are connected with the protrusions 23 via the adhesive 21.

The wiring patterns 12 connected with the bypass condensers 9 become bias patterns to be connected with an external electric power source circuit. Due to the above arrangement, the bypass condensers 9 are connected between the bias patterns and the ground.

Further, the coupling condensers 31 inserted into a signal line of the high frequency IC package 5 are mounted on the upper face of the board 7. In the same manner as that of the bypass condensers 9, each coupling condenser 31 has two pieces of electrodes 17 and 18. The coupling condensers 31 are mounted in the middle of the wiring patterns 12. The wiring patterns 12 connected with the coupling condenser 31 form signal line patterns.

The wiring patterns 12 in the high frequency IC package 5 and the wiring patterns 24 on the circuit board 4 are connected with each other by means of the wire bonding connections 15. In this connection, in the present invention, instead of the wire bonding connection 15, it is possible to use the bonding connection using thin film conductor. Alternatively, it is possible to use any other arbitrary connection means except for the bonding connection.

Figure 5:
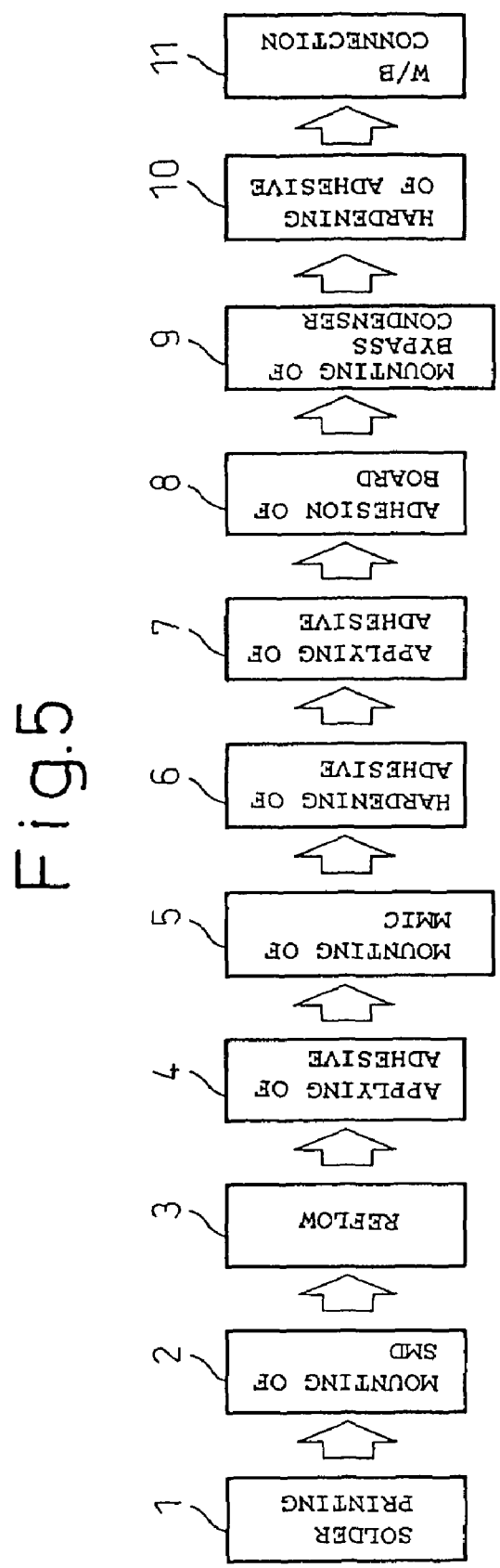
FIG. 5 is a view showing a manufacturing process of a high frequency unit shown in FIG. 3.

Referring to FIG. 5, the process of manufacturing the high frequency unit 6 shown in FIG. 3 will be explained below.

In this connection, the following manufacturing process is an example. Therefore, the order of the process can be appropriately changed.

Solder printing of cream solder is conducted on the circuit board 4 (process 1), the surface mounting devices (SMD) are set on the solder printing (process 2), and the surface mounting devices are fixed onto the circuit board 4 by the reflow of the printed solder (process 3). The adhesive 3 is coated on the housing chassis 1 (process 4), the high frequency IC package 5 is set on the housing chassis 1 (process 5), and the adhesive 3 is hardened and the high frequency IC package 5 is fixed onto the housing chassis 1 (process 6).

The housing chassis 1 and the high frequency IC package 5 are coated with the adhesive 2, 21 (process 7), the circuit board 4 is set on the housing chassis 1 (process 8), the bypass condensers 9 and the coupling condensers 31 are set on the high frequency IC package 5 (process 9), and the adhesive 2, 21 is hardened (process 10) so that the bypass condensers 9 and the coupling condensers 31 are fixed onto the circuit board 4. Finally, the wiring patterns 12 of the high frequency IC package 5 and the wiring patterns 24 on the circuit board 4 are connected with each other by means of the wire bonding connections 15 (process 11).

According to this Embodiment 1, as the bypass condensers 9 and the coupling condensers 31 are not mounted in the cap 14, the high frequency IC package 5 can be downsized. Further, it becomes unnecessary that the high frequency IC chip 8, bypass condensers 9 and coupling condensers 31 are subjected to the MCM mounting. Accordingly, the occurrence of defective connection of the chip can be decreased, and the yield can be enhanced.

EMBODIMENT 1

Variation 1

Referring to FIG. 6, the first variation of Embodiment 1 will be explained below. FIG. 6(A) is an upper view of a high frequency IC package, and FIG. 6(B) is a sectional view taken on line B-B in FIG. 6(A).

In this connection, in the following explanations, different points from the above Embodiment 1 will be mainly explained, and overlapping explanations will be omitted here.

An upper and lower side electrode type single layer ceramic condenser, in which the electrodes 17, 18 are arranged on the upper and lower sides of the dielectrics 16 such as a single layer ceramics, is adopted for each bypass condenser 9. The lower electrode 18 is stuck and mounted onto the ground pattern 19 by the adhesive 27. The upper electrode 17 is connected with the wiring pattern 12 by means of the wire bonding connection 15. The ground patterns 19 are connected with the ground pattern 10 on the lower face of the board 7 by the via holes 13. Although the coupling condensers 31 are not shown in FIG. 6(B), they are composed in the same manner as that of the bypass condensers 9.

EMBODIMENT 1

Variation 2

Figure 7:
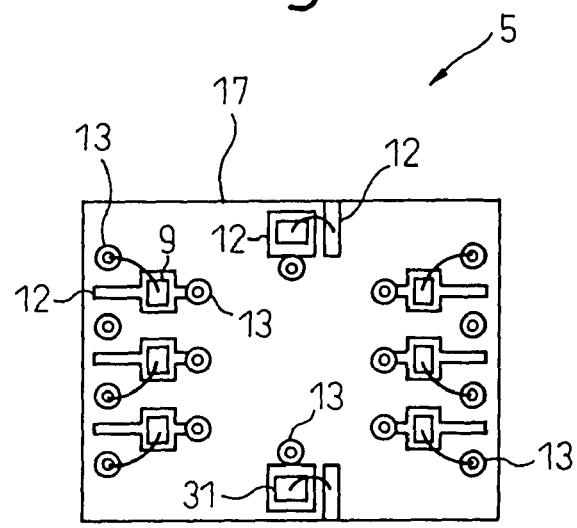
FIG. 7 is a view showing a structure of a high frequency IC package of Variation 2 of Embodiment 1 of the present invention.

Referring to FIG. 7, the second variation of Embodiment 1 will be explained below. FIG. 7 is an upper view of a high frequency IC package.

Different points of this variation 2 from the above variation 1 will be explained below. The bypass condensers 9 are mounted on the wiring patterns 12, and the wire bonding connections 15 connect the bypass condensers 9 with the via holes 13 which are connected with the ground pattern 10 provided on the lower face of the board 7. The coupling condensers 31 are mounted on the wiring patterns 12 on the via holes 13 side.

EMBODIMENT 2

The high frequency IC package 5 of the above Embodiment 1 is advantageous as described above. However, Embodiment 1 is disadvantageous as follows. In Embodiment 1, it is necessary to provide processes (processes 7, 9 and 10 shown in FIG. 5) in which the bypass condensers 9 and the coupling condensers 31 are mounted on the high frequency IC package 5 by the adhesive 21. In this Embodiment 2, the above processes are deleted.

Figure 8:
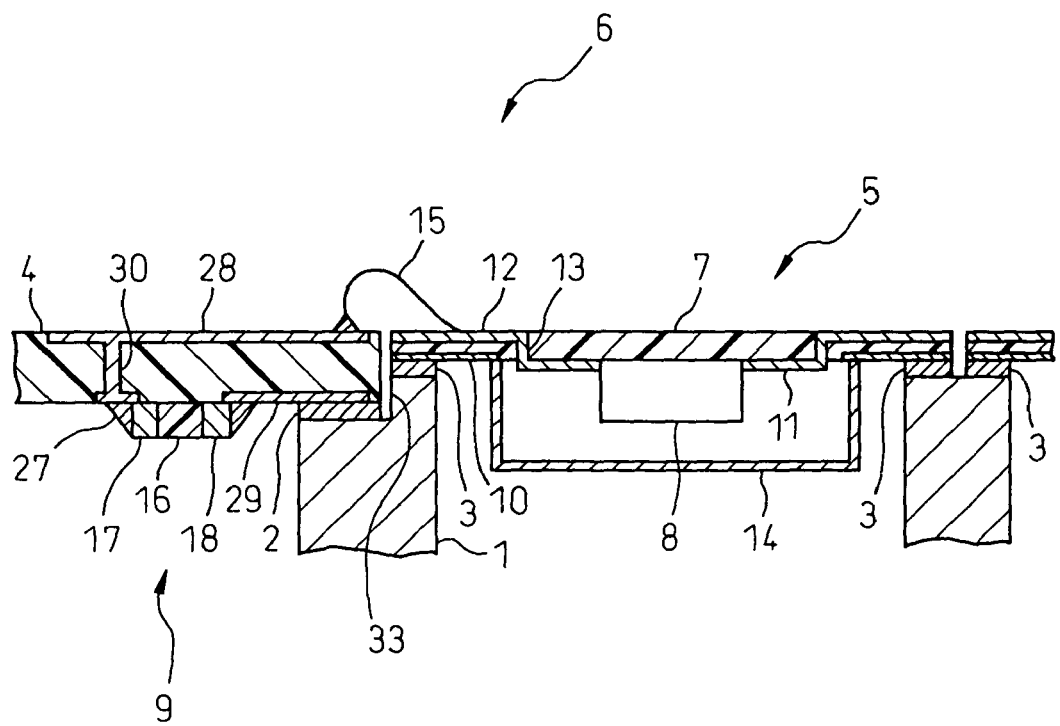
FIG. 8 is a view showing a structure of a high frequency unit in Embodiment 2 of the present invention.

FIG. 8 is a sectional side view of the high frequency unit 6. In the following explanations, different points from the above Embodiment 1 will be mainly explained, and overlapping explanations will be omitted here.

In this Embodiment 2, the bypass condensers 9 are mounted on the circuit board 4. Two pieces of electrodes 17, 18 of each bypass condenser 9 are mounted on the wiring patterns 29, which are formed on a lower face of the circuit board 4, by means of reflow and are fixed by the solder 27. The bypass condensers 9 are fixed by means of reflow in the same manner as that of other parts which are mounted on the surface of the circuit board 4.

The wiring patterns 29 are connected with the wiring patterns 28 on the upper face via the via holes 30. The wiring patterns 29 on the lower face are electrically connected with the housing chassis 1 and grounded when the circuit board 4 is mounted on the housing chassis 1 by the adhesive 2. The wiring patterns 12 of the high frequency IC package 5 are connected with the wiring patterns 28 on the upper face of the circuit board 4 by means of wire bondings 15. Due to the foregoing, the bypass condensers 9 are connected between the bias patterns of the high frequency IC package 5 and the ground.

In FIG. 8, the coupling condensers are not illustrated, however, the coupling condensers are arranged on the lower face of the circuit board 4 by the same means as that of the bypass condensers 9.

As shown in FIG. 8, the step portion 33 is formed between a portion in which the high frequency IC package 5 of the housing chassis 1 is mounted and a portion in which the circuit board 4 is mounted. Due to the above structure, the height of the high frequency IC package 5 and the height of the circuit board 4 can be made to be identical with each other. In this way, the high frequency IC package 5 and the circuit board 4 can be made to be on the same surface, and wire bonding can be easily conducted.

Figure 9:
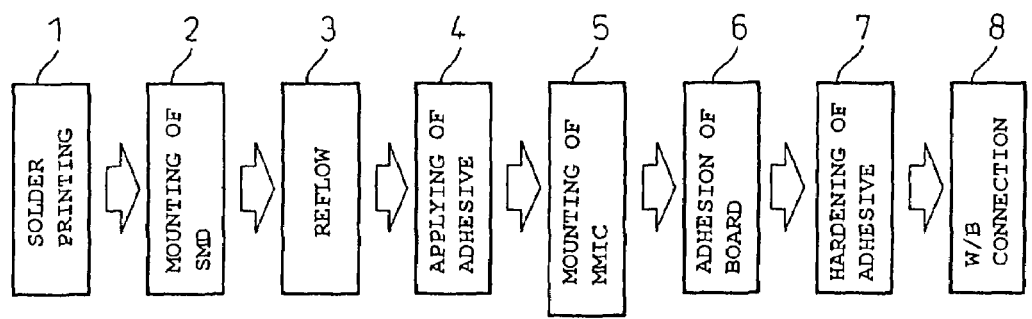
FIG. 9 is a view showing a manufacturing process of a high frequency unit shown in FIG. 8.

Referring to FIG. 9, the process of manufacturing the high frequency unit 6 shown in FIG. 8 will be explained below. In this connection, the following manufacturing process is an example. Therefore, the order of the process can be appropriately changed.

Solder printing of cream solder is conducted on the circuit board 4 (process 1), the surface mounting devices (SMD), which include the bypass condensers 9 and coupling condensers 31, are set on the solder printing (process 2), and the surface mounting devices are fixed onto the circuit board 4 by the reflow of the printed solder (process 3). The adhesive 2, 3 is coated on the housing chassis 1 (process 4), the high frequency IC package 5 is set on the housing chassis 1 (process 5), the circuit board 4 is mounted (process 6), and the adhesive 2, 3 is hardened (process 7). Finally, the wiring patterns 12 of the high frequency IC package 5 and the wiring patterns 28 of the circuit board 4 are connected with each other by means of wire bondings 15 (process 8).

According to this Embodiment 2, the bypass condensers 9 and the coupling condensers 31 are automatically mounted simultaneously with other surface mounting devices by means of reflow. Accordingly, as can be seen when the process chart of this embodiment is compared with the process chart of Embodiment 1 shown in FIG. 5, it is possible to omit the processes (processes 7, 9 and 10) of coating and hardening the adhesive.

EMBODIMENT 2

Variation 1

The high frequency unit 6 of the above Embodiment 2 is advantageous as described above. However, the above Embodiment 2 is disadvantageous in that a distance from the high frequency IC chip 8 to the ground via the bypass condensers 9 is increased. For the above reasons, a problem is caused in which it is impossible to effectively prevent the occurrence of high frequency oscillation. This variation 1 is provided to shorten the distance from the high frequency IC chip 8 to the ground.

Figure 10:
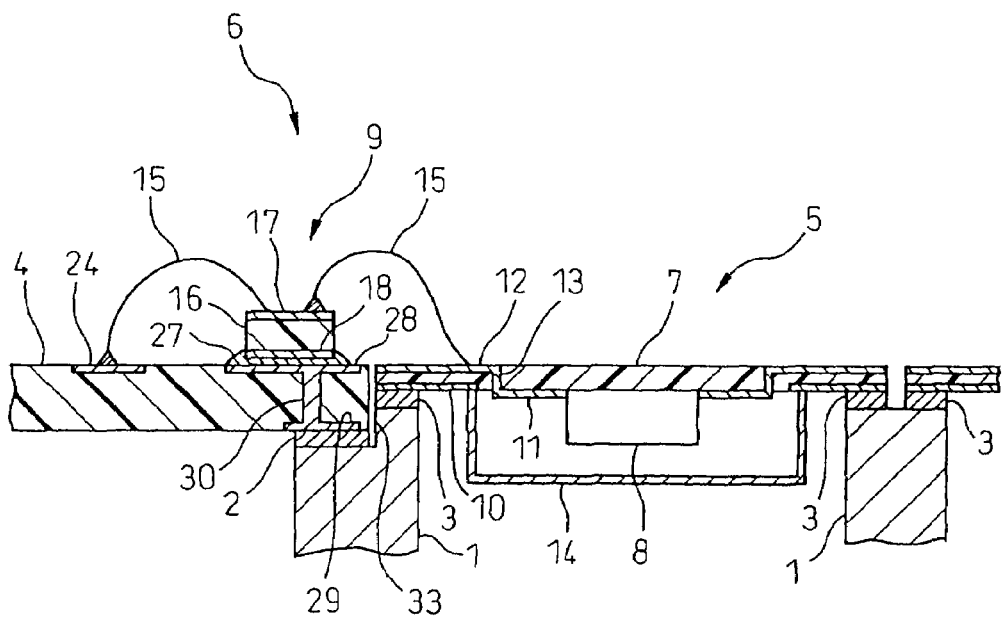
FIG. 10 is a view showing a structure of a high frequency IC package of Variation 1 of Embodiment 2 of the present invention.

FIG. 10 is a sectional side view showing a state in which the high frequency IC package is mounted on the high frequency unit 6, and FIG. 11 is a view showing electrical connections in FIG. 10. In the following explanations, only points of the variation different from the above Embodiment 2 will be explained.

An upper and lower side electrode type single layer ceramic condenser is adopted for each bypass condenser 9. The wiring patterns 28, 29 are formed on the upper and the lower face of the circuit board 4 at positions close to the high frequency IC package 5 so that the wiring patterns 28, 29 can be located right above the housing chassis 1. The via holes 30 are formed right below the wiring patterns 28 and right above the wiring patterns 29. Both the wiring patterns 28, 29 are connected with each other by the via holes 30. That is, the wiring patterns 29 are formed on a surface of the lower surface of the step portion of the housing chassis 1, and further the wiring patterns 28 are formed right above this portion. Accordingly, the via holes 30 are formed in a portion in which the bypass condensers 9 and the housing chassis 1 are put on each other in the vertical direction.

The lower electrodes 18 of the bypass condensers 9 are mounted on the wiring patterns 28 on the upper face of the circuit board 4 by the reflow solder 27. The upper electrodes 17 of the bypass condensers 9 are connected with the wiring patterns 12 of the high frequency IC package 5 and the wiring patterns 24 of the circuit board 4 by means of the wire bonding connection 15.

The manufacturing process of the high frequency unit 6 shown in FIG. 10 is the same as that shown in FIG. 9.

According to this Variation 1, it is possible to provide the same effect as that of the above Embodiment 2 in which the bypass condensers 9 can be mounted simultaneously with other parts. Further, in this Variation 1, the structure and arrangement of the bypass condensers 9 are improved so that the electrical distance from the high frequency IC chip 8 to the ground can be shortened. Therefore, the occurrence of high frequency oscillation can be positively prevented.

The wiring patterns 12 of the high frequency IC package 5, bypass condensers 9 and wiring patterns 24 of the circuit board 4 can be connected in various ways as shown in FIG. 11.

FIG. 11(A) shows the same example as that shown in FIG. 10. In FIG. 11(A), the upper electrodes 17 of the bypass condensers 9 are connected with the wiring patterns 12 of the high frequency IC package 5 and the wiring patterns 24 of the circuit board 4. In FIG. 11(B), the wiring patterns 12 of the high frequency IC package 5 are connected with the upper electrodes 17 of the bypass condensers 9 and the wiring patterns 24 on the circuit board 4. In FIG. 11(C), the wiring patterns 24 on the circuit board 4 are connected with the wiring patterns 12 of the high frequency IC package 5 and the upper electrode 17 of the bypass condensers 9.

EMBODIMENT 3

Figure 12:
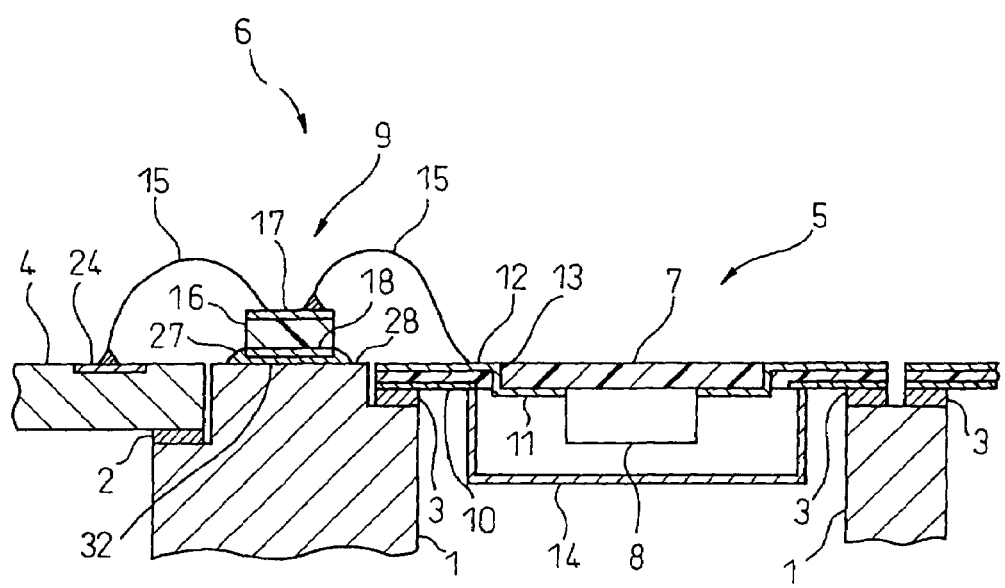
FIG. 12 is a view showing a structure of a high frequency unit in Embodiment 3 of the present invention.
Figure 5:
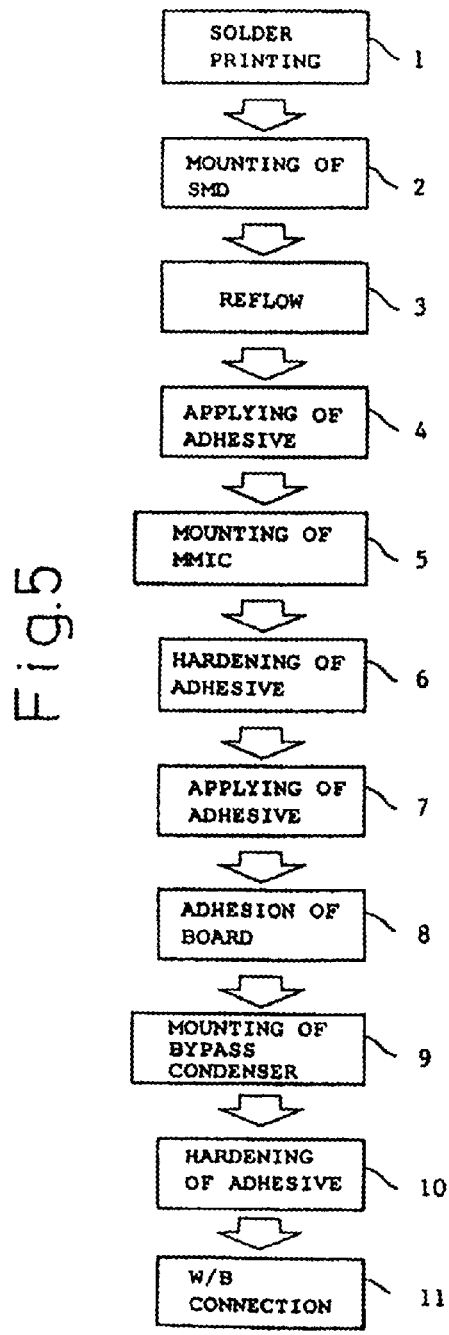

Referring to FIGS. 12 and 13, Embodiment 3 of the present invention will be explained below. In the following explanations, points different from the above Embodiment 2 shown in FIG. 10 will be mainly explained, and overlapping explanations are omitted here.

FIG. 12 is a side view of a state of the high frequency IC package which is mounted on the high frequency unit 6.

The housing chassis 1 is composed so that the upper end portion 32 of the housing chassis 1 can be exposed from between the high frequency IC package 5 and the circuit board 4. The bypass condensers 9, each which is composed as an upper and lower side electrode type single layer ceramic condenser, are mounted on the upper end portion 32 of the housing chassis 1 by means of reflow and fixed by the solder 27.

According to this embodiment, the lower electrodes 18 of the bypass condensers 9 are directly grounded. Therefore, it is possible to omit the wiring patterns to be provided between the bypass condenser 9 and the ground.

The wiring patterns 12 of the high frequency IC package 5, bypass condensers 9 and wiring patterns 24 of the circuit board 4 can be connected in various ways as shown in FIG. 13.

FIG. 13(A) shows the same example as that shown in FIG. 12. In FIG. 13(A), the upper electrodes 17 of the bypass condensers 9 are connected with the wiring patterns 12 of the high frequency IC package 5 and the wiring patterns 24 of the circuit board 4. In FIG. 13(B), the wiring patterns 12 of the high frequency IC package 5 are connected with the upper electrodes 17 of the bypass condensers 9 and the wiring patterns 24 on the circuit board 4. In FIG. 13(C), the wiring patterns 24 on the circuit board 4 are connected with the wiring patterns 12 of the high frequency IC package 5 and the upper electrodes 17 of the bypass condensers 9.

According to the present invention, the structure of the high frequency IC package and the high frequency unit, into which the high frequency IC package is incorporated, can be simplified and downsized.

According to the present invention, the number of processes in the methods of manufacturing the high frequency IC package and the high frequency unit can be reduced.

The invention claimed is:

1. A high frequency IC package comprising:
   a board;
   a high frequency IC chip provided and sealed on the board; and
   a part to prevent an oscillation of high frequency waves from the high frequency IC chip, provided on the board and outside the sealing of the high frequency IC chip.

2. A high frequency IC package according to claim 1, wherein the part has electrodes on the upper and lower sides.

3. A high frequency IC package according to claim 2, wherein the lower electrode of the part is provided on a wiring pattern formed on the board.

4. A high frequency IC package according to claim 3, wherein the part is a coupling condenser, the lower electrode of the part is provided on the wiring pattern on the board, and the upper electrode is connected with another wiring pattern formed on the board by a connecting means.

5. A high frequency IC package according to claim 3, wherein the part is a bypass condenser, the lower electrode is provided on one of the bias pattern and the ground pattern formed on the board, and the upper electrode is connected with the bias pattern or the ground pattern formed on the board by a connecting means.

6. A high frequency IC package according to claim 1, wherein the part is provided on a face of the board opposite to the face on which the high frequency IC chip is provided.

7. A high frequency IC package according to claim 1, wherein the board comprises a via hole and wherein the part is electrically connected with the high frequency IC chip through the via hole.

8. A high frequency IC package according to claim 1, wherein the part to determine the characteristic of the IC chip is electrically connected with the IC chip.

9. A high frequency IC package according to claim 1, wherein the part comprises a first electrode, a second electrode, and a dielectric element and wherein the dielectric element is coupled between the first electrode and the second electrode.

10. A high frequency IC package comprising:
a board;
a high frequency IC chip provided and sealed on the board; and
a part to prevent an oscillation of high frequency waves from the high frequency IC chip, provided outside the sealing of the high frequency IC chip,
wherein the part comprising one of a bypass condenser, a coupling condenser, a temperature compensating condenser, a temperature compensating resistance, and an impedance adjusting inductance.

11. A high frequency IC package comprising:
a circuit board;
a wiring pattern provided on the circuit board;
a high frequency IC chip provided and sealed on the circuit board; and
a part adapted to prevent an oscillation of high frequency waves from the high frequency IC chip and provided on the board and outside the sealing of the high frequency IC chip,
wherein the part is electrically connected with the IC chip through the wiring pattern.

* * * * *

UNITED STATES PATENT AND TRADEMARK OFFICE
CERTIFICATE OF CORRECTION

| | |
|---|---|
| PATENT NO. | : 7,339,269 B2 |
| APPLICATION NO. | : 10/220409 |
| DATED | : March 4, 2008 |
| INVENTOR(S) | : Hiroaki Matsuki |

It is certified that error appears in the above-identified patent and that said Letters Patent is hereby corrected as shown below:

In the Drawings

Fig. 5, Sheet 5 of 11    Delete Drawing Sheet 5 and substitute therefore the Drawing Sheet, consisting of Fig. 5, as shown on the attached page Signed and Sealed this Thirtieth Day of December, 2008

JON W. DUDAS
*Director of the United States Patent and Trademark Office*